United States Patent
Yu

(10) Patent No.: US 11,540,405 B2
(45) Date of Patent: Dec. 27, 2022

(54) SERVER APPARATUS AND COVER STRUCTURE THEREOF

(71) Applicant: Wistron Corporation, New Taipei (TW)

(72) Inventor: Zhi-Tao Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 214 days.

(21) Appl. No.: 17/027,723

(22) Filed: Sep. 22, 2020

(65) Prior Publication Data
US 2022/0015250 A1 Jan. 13, 2022

(30) Foreign Application Priority Data
Jul. 8, 2020 (CN) .......................... 202010651387.2

(51) Int. Cl.
*H05K 5/02* (2006.01)
*H05K 5/03* (2006.01)

(52) U.S. Cl.
CPC ............. *H05K 5/0221* (2013.01); *H05K 5/03* (2013.01)

(58) Field of Classification Search
CPC ...... H05K 5/0239; H05K 5/0221; H05K 5/03; H05K 7/1487; H05K 9/0022; G06F 1/187
See application file for complete search history.

(56) References Cited

U.S. PATENT DOCUMENTS

| 6,637,847 | B2 * | 10/2003 | Crisp | G06F 1/181 292/DIG. 37 |
| 8,154,863 | B2 * | 4/2012 | Yang | G06F 1/187 361/679.37 |
| 9,532,478 | B1 * | 12/2016 | Good | H05K 7/1401 |
| 10,759,039 | B2 * | 9/2020 | Wu | H05K 5/023 |
| 2004/0233619 | A1 * | 11/2004 | Heistand, II | G06F 1/181 361/679.57 |
| 2007/0044408 | A1 * | 3/2007 | Hsu | H05K 7/1487 312/223.1 |
| 2011/0001031 | A1 * | 1/2011 | Peng | G11B 33/128 248/316.7 |
| 2011/0095151 | A1 * | 4/2011 | Zhang | G11B 33/124 248/222.12 |
| 2011/0141680 | A1 * | 6/2011 | Yang | G11B 33/124 361/679.31 |

(Continued)

FOREIGN PATENT DOCUMENTS

| CN | 202533833 U | 11/2012 |
| JP | 2004-111777 | 4/2004 |

*Primary Examiner* — Hung S. Bui
*Assistant Examiner* — Sagar Shrestha
(74) *Attorney, Agent, or Firm* — Winston Hsu

(57) ABSTRACT

A server apparatus includes a frame having an opening, a storage device and a cover structure. The storage device is contained in the frame through the opening. A first abutting member is disposed at a side of the frame. The cover structure includes a first latch, a first resilient member and a cover covering the opening and having a first side portion. A first connection end portion of the first latch is movably disposed on the first side portion to make a first hook end portion of the first latch movable. The first resilient member is connected to the first latch and the first side portion to drive the first hook end portion to hook the first abutting member for fixing the cover at the opening.

18 Claims, 10 Drawing Sheets

(56) References Cited

U.S. PATENT DOCUMENTS

| | | | | |
|---|---|---|---|---|
| 2014/0319017 | A1* | 10/2014 | Lu | G06F 1/187 |
| | | | | 206/565 |
| 2017/0094828 | A1* | 3/2017 | Van Pelt | H05K 7/1489 |
| 2019/0286197 | A1* | 9/2019 | Khan | G06F 1/20 |
| 2020/0061800 | A1* | 2/2020 | Wu | B25G 3/08 |

* cited by examiner

SERVER APPARATUS AND COVER STRUCTURE THEREOF

BACKGROUND OF THE INVENTION

1. Field of the Invention

The present disclosure relates to a server apparatus and a cover structure thereof, and more specifically, to a server apparatus utilizing a latch to hook an abutting member of a frame for detachably fixing a cover at an opening of the frame and a cover structure thereof.

2. Description of the Prior Art

In general, there is usually a storage device (e.g. SSD (Solid State Drive), EDSFF (Enterprise & Datacenter Storage Form Factor) drive, etc.) detachably disposed on a server apparatus for a user to perform data access and update of the server apparatus by hot plugging the storage device. The conventional configuration is to detachably insert the storage device into an extraction opening of a frame of the server apparatus, so as to make the storage device detachable for subsequent maintenance or replacement of the storage device. In this design, for further providing a dustproof and EMI (Electromagnetic Interference) shielding function, a cover structure is additionally disposed on the extraction opening of the frame. In such a manner, the server apparatus can utilize the cover structure to cover the extraction opening of the frame for generating the dustproof and EMI shielding effect.

For detachably fixing the cover structure at the extraction opening, the prior art usually adopts the design that a hook mechanism disposed on the cover structure can be pressed laterally for releasing structural engagement of the cover structure and the frame. However, the aforesaid design of additionally disposing the hook mechanism on the cover structure may increase the overall thickness of the cover structure to occupy excessive front-end space of the frame, so as to be disadvantageous to the thinning design of the server apparatus and make a long storage device unable to be disposed in the frame.

SUMMARY OF THE INVENTION

The present disclosure provides a server apparatus including a frame, at least one storage device, and a cover structure. The frame has an opening. A side of the frame has a first abutting member disposed thereon. The at least one storage device is contained in the frame through the opening. The cover structure is disposed on the frame corresponding to the opening. The cover structure includes a cover, a first latch, and a first resilient member. The cover detachably covers the opening and has a first side portion. The first latch is located between first side portion and the first abutting member. The first latch has a first connection end portion and a first hook end portion. The first connection end portion is movably disposed on the first side portion to make the first hook end portion movable. The first hook end portion has a first detaching slanted surface formed thereon. The first resilient member is connected to the first latch and the first side portion to drive the first hook end portion to abut the first detaching slanted surface against the first abutting member, for detachably fixing the cover at the opening.

The present disclosure further provides a cover structure disposed corresponding to an opening of a frame of a server apparatus. A side of the frame has a first abutting member disposed thereon. At least one storage device is contained in the frame through the opening. The cover structure includes a cover, a first latch, and a first resilient member. The cover detachably covers the opening and has a first side portion. The first latch is located between first side portion and the first abutting member. The first latch has a first connection end portion and a first hook end portion. The first connection end portion is movably disposed on the first side portion to make the first hook end portion movable. The first hook end portion has a first detaching slanted surface formed thereon. The first resilient member is connected to the first latch and the first side portion to drive the first hook end portion to abut the first detaching slanted surface against the first abutting member, for detachably fixing the cover at the opening.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
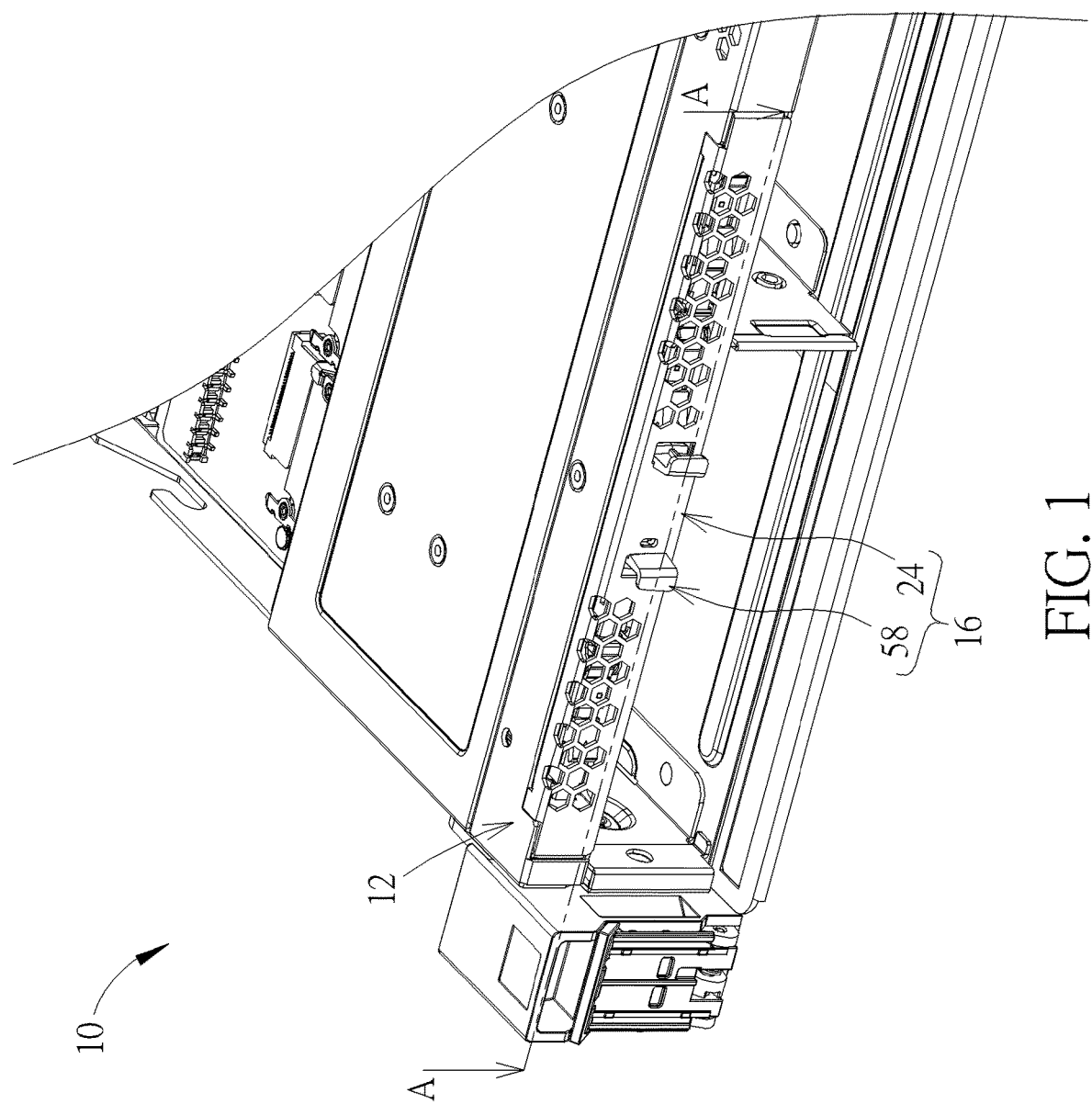
FIG. 1 is a partial enlarged diagram of a server apparatus according to an embodiment of the present disclosure.
Figure 2:
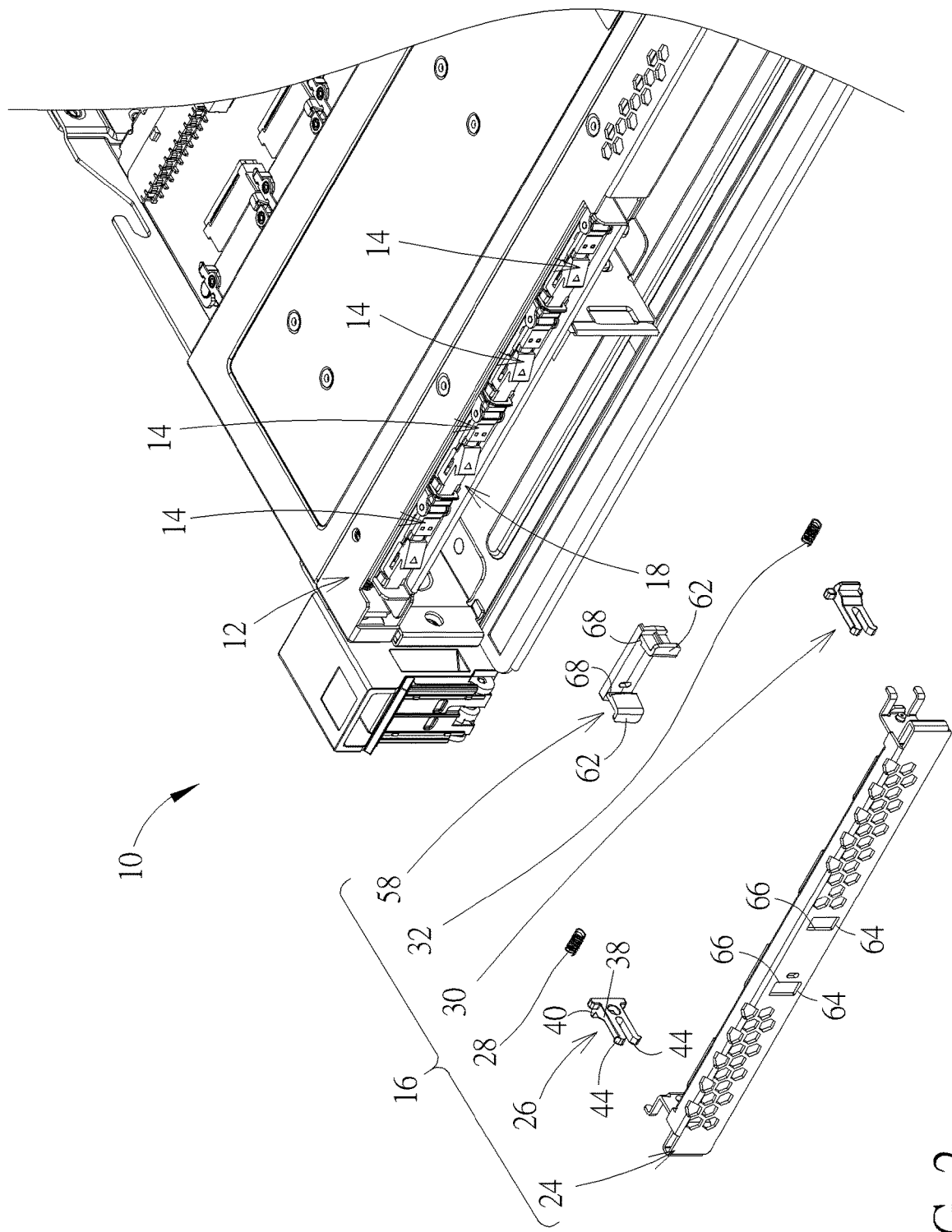
FIG. 2 is a partial exploded diagram of the server apparatus in FIG. 1.
Figure 3:
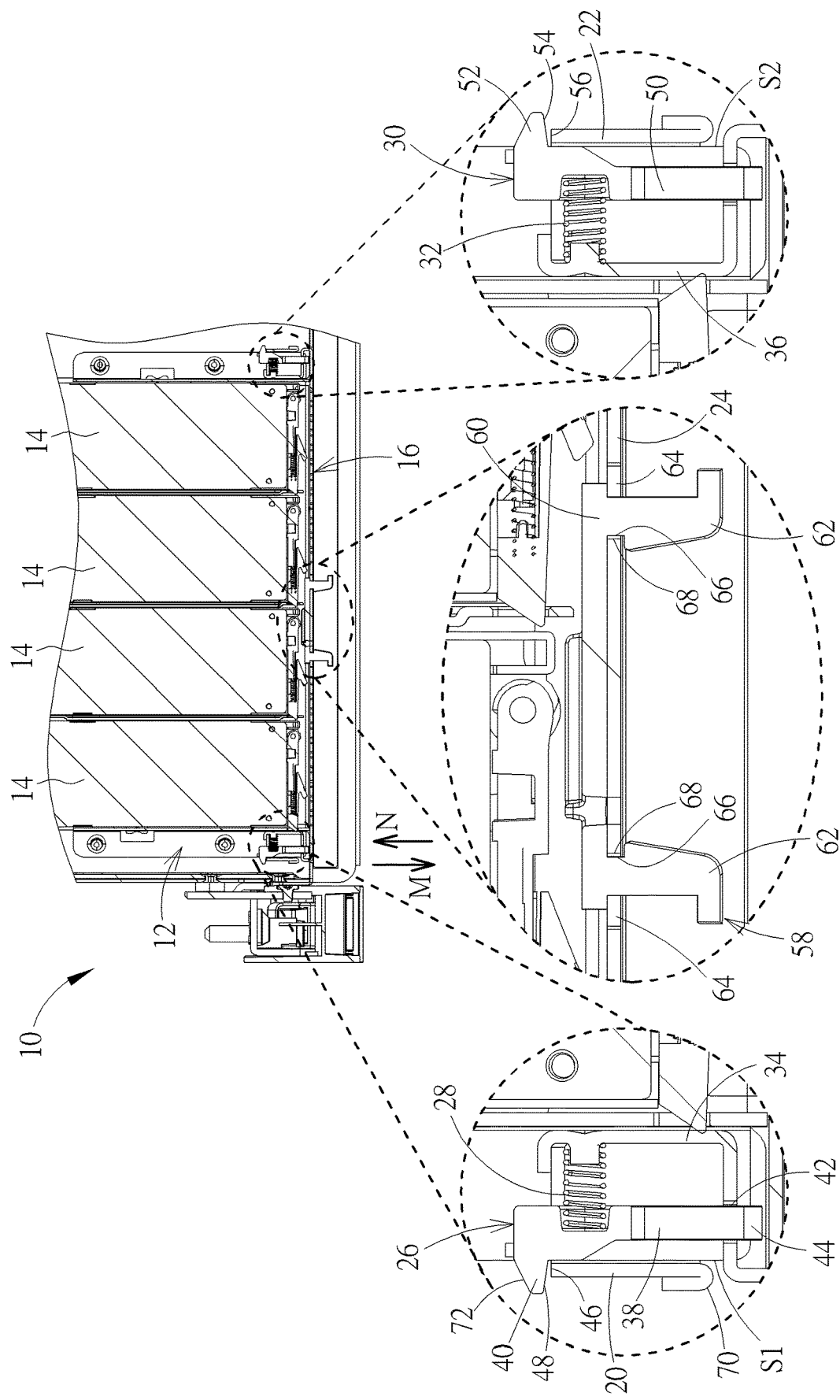
FIG. 3 is a cross-sectional diagram of the server apparatus in FIG. 1 along a cross-sectional line A-A.

Please refer to FIG. 1, FIG. 2, and FIG. 3. FIG. 1 is a partial enlarged diagram of a server apparatus 10 according to an embodiment of the present disclosure. FIG. 2 is a partial exploded diagram of the server apparatus 10 in FIG. 1. FIG. 3 is a cross-sectional diagram of the server apparatus 10 in FIG. 1 along a cross-sectional line A-A. As shown in FIGS. 1-3, the server apparatus 10 includes a frame 12, at least one storage device 14 (four shown in FIG. 2, but the present disclosure is not limited thereto), and a cover structure 16. The frame 12 has an opening 18 formed thereon. A first side S1 of the frame 12 has a first abutting member 20 disposed thereon, and a second side S2 of the frame 12 has a second abutting member 22 disposed thereon. The first abutting member 20 and the second abutting member 22 could be preferably a bent edge directly bent from the frame 12 (but the present disclosure is not limited thereto, meaning that the present disclosure could utilize an abutting structure independently disposed on the frame 12 in another embodiment). The storage device 14 could be preferably an EDSFF drive (but the present disclosure is not limited thereto). The storage device 14 is detachably contained in the frame 12 through the opening 18 for a user to perform the subsequent extraction operation of the storage device 14 conveniently.

Figure 4:
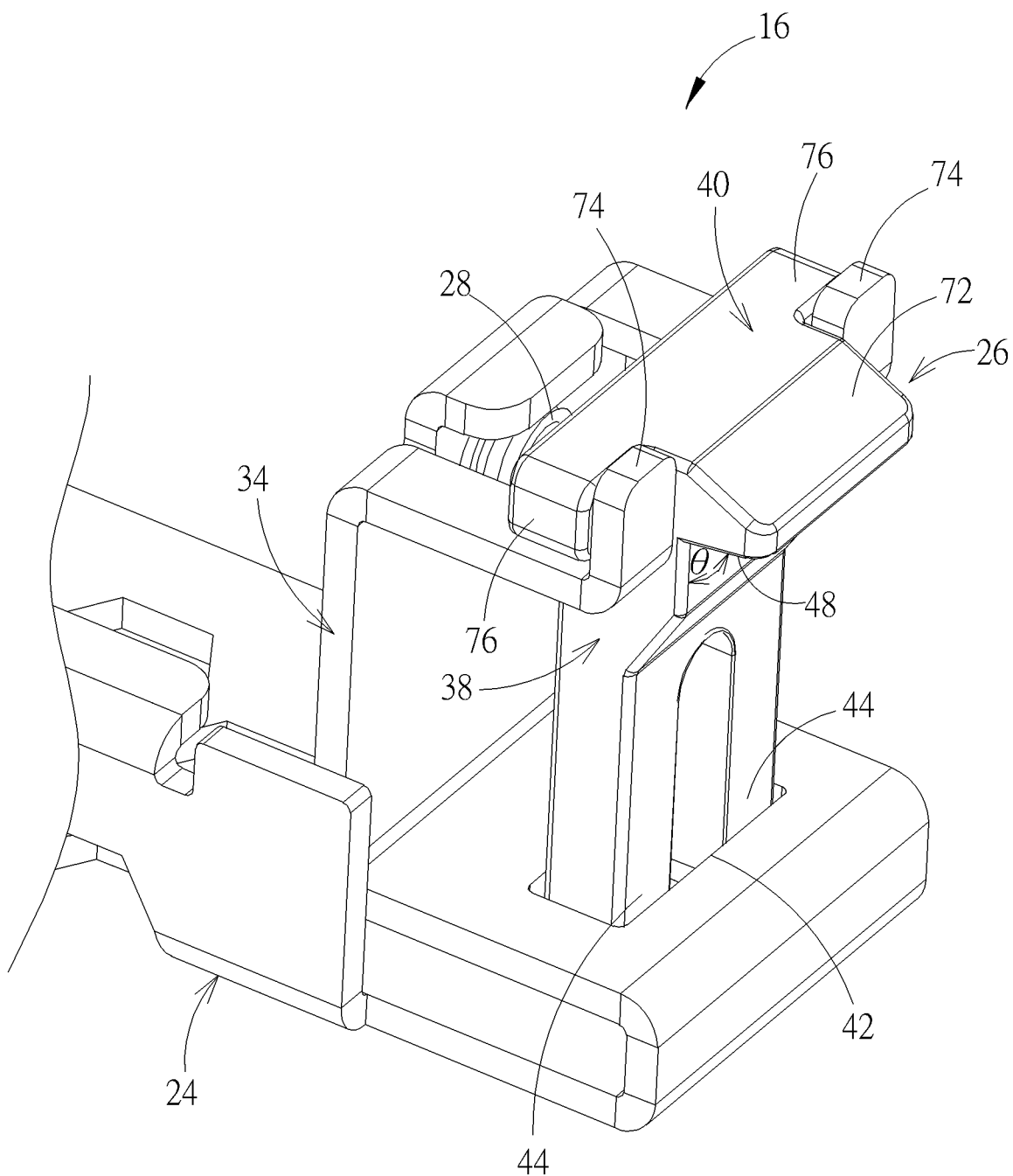
FIG. 4 is a partial assembly diagram of a cover structure in FIG. 2.

As for the structural design of the cover structure 16, please refer to FIG. 2, FIG. 3, and FIG. 4. FIG. 4 is a partial assembly diagram of the cover structure 16 in FIG. 2. As shown in FIGS. 2-4, the cover structure 16 is disposed on the frame 12 corresponding to the opening 18. The cover structure 16 includes a cover 24, a first latch 26, a first resilient member 28 (preferably a spring, but the present disclosure is not limited thereto), a second latch 30, and a second resilient member 32 (preferably a spring, but the present disclosure is not limited thereto). The cover 24 could be preferably made of metal material (e.g. SGCC material, but the present disclosure is not limited thereto) for generating the EMI shielding effect. The cover 24 detachably covers the opening 18 and has a first side portion 34 and a second side portion 36. In this embodiment, as shown in FIG. 3 (but the present disclosure is not limited thereto), the first side portion 34 could be bent inward from the first side S1 of the cover 24 to be opposite to the first abutting member 20, and the second side portion 36 could be bent inward from the second side S2 of the cover 24 to be opposite to the second abutting member 22. The first latch 26 is located between the first side portion 34 and the first abutting member 20 and has a first connection end portion 38 and a first hook end portion 40. The first connection end portion 38 is movably disposed on the first side portion 34 to make the first hook end portion 40 movable. To be more specific, in this embodiment, a through hole 42 is formed on the first side portion 34 corresponding to the first connection end portion 38, and at least one hook arm 44 (preferably two elastic arms as shown in FIG. 4, but the present disclosure is not limited thereto) extends from the first connection end portion 38. Accordingly, the hook arm 44 can be movably engaged with the through hole 40 to make the first hook end portion 40 swingable relative to the first side portion 34 (but the present disclosure is not limited thereto, meaning that the present disclosure could adopt other pivotal connection design, such as the design that the first connection end portion 38 is pivoted to the cover 24 in a shaft-to-hole manner). A first detaching slanted surface 48 is formed on the first hook end portion 40 corresponding to the first abutting member 20 (e.g. corresponding to a first rear edge 46 of the first abutting member 20, but the present disclosure is not limited thereto). A tilt angle θ between the first detaching slanted surface 48 and the first connection end portion 38 could be preferably between 95° and 110° (but the present disclosure is not limited thereto), so that the first hook end portion 40 can be disengaged from the first abutting member 20 and then slide along the first abutting member 20 more smoothly. The first resilient member 28 is connected to the first latch 26 and the first side portion 34 for driving the first hook end portion 40 to abut the first detaching slanted surface 48 against the first rear edge 46 of the first abutting member 20.

Similarly, in this embodiment, the second latch 30 is located between the second side portion 36 and the second abutting member 22 and has a second connection end portion 50 and a second hook end portion 52. The second connection end portion 50 is movably disposed on the second side portion 36 to make the second hook end portion 52 movable. The connection design of the second connection end portion 38 and the second side portion 36 is similar to the aforesaid connection design of the first connection end portion 38 and the first side portion 34, and the related description is therefore omitted. A second detaching slanted surface 54 is formed on the second hook end portion 52 corresponding to the second abutting member 22. The second resilient member 32 is connected to the second latch 30 and the second side portion 36 for driving the second hook end portion 52 to abut the second detaching slanted surface 54 against a second rear edge 56 of the second abutting member 22.

In practical application, for operational convenience, the cover structure 16 could further include a handle 58. The handle 58 is disposed on the cover 24 such that the cover 24 can be operably pulled out or pushed in. To be more specific, in this embodiment, as shown in FIG. 3, the handle 58 has a sheet 60 and at least one bent arm 62 (two shown in FIG. 3, but the present disclosure is not limited thereto). A through hole 64 is formed on the cover 24 corresponding to the bent arm 62. The bent arm 62 protrudes from the sheet 60, and a recessed structure 66 is formed at a position where the bent arm 62 is connected to the sheet 60. Accordingly, the recessed structure 66 can be engaged with a hole edge of the through hole 64 to fix the handle 58 on the cover 24 when the bent arm 62 penetrates through the through hole 64. To be noted, the present disclosure could adopt the design that the cover 24 is formed integrally with the handle 58 in another embodiment. For example, in another embodiment, the handle 58 and the cover 24 are made of plastic material and are formed integrally by an injection molding process, and a metal sheet is disposed on the cover 24 for generating the EMI shielding effect.

For assembly convenience, in this embodiment, an assembling slanted surface 72 is further formed on the first hook end portion 40 corresponding to the first abutting member 20 (e.g. corresponding to a front edge 70 of the first abutting member 20, but the present disclosure is not limited thereto). Accordingly, with movement of the cover 24 being pushed inward relative to the opening 18, the first hook end portion 40 can swing to be misaligned with the first abutting member 20 and then slide along the first abutting member 20 smoothly during the process of the assembling slanted surface 72 abutting against the front edge 70 and then sliding backward relative to the front edge 70. As such, the first latch 26 can be pushed through the opening 18 smoothly. Furthermore, in this embodiment, as shown in FIG. 4, at least one blocking arm 74 (two shown in FIG. 4, but the present disclosure is not limited thereto) extends from the first side portion 34 toward the first hook end portion 40, and a protruding portion 76 protrudes from the first hook end portion 40 corresponding to the blocking arm 74. In such a manner, the blocking arm 74 can block the protruding portion 76 to limit the movement range of the first hook end portion 40 relative to the first side portion 34. To be noted, the aforesaid slanted surface design and the aforesaid limiting design could be applied to the second latch 30, and the related description could be reasoned by analogy and omitted herein.

Figure 5:
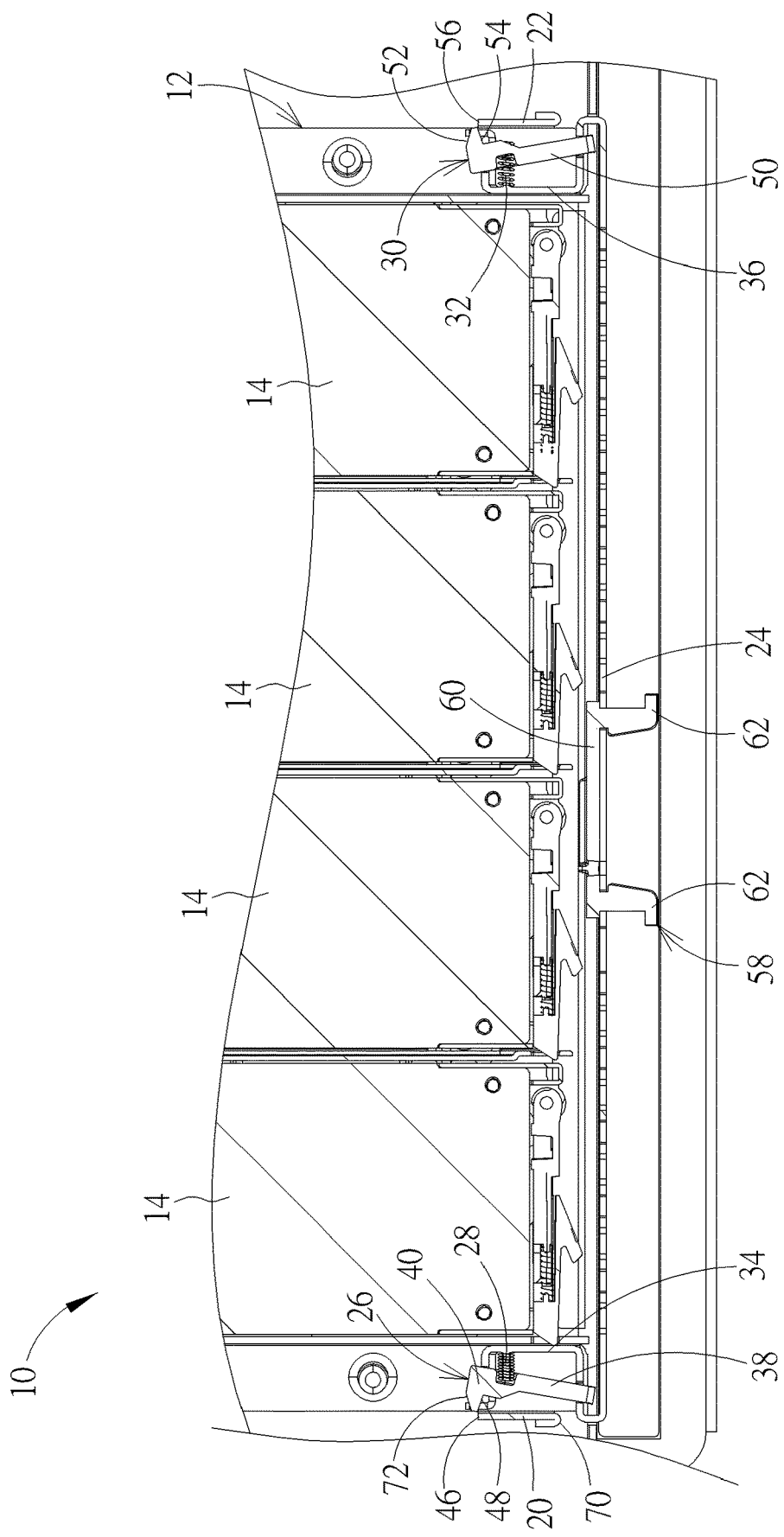
FIG. 5 is a cross-sectional diagram of a first detaching slanted surface in FIG. 3 sliding forward relative to a first rear edge when a cover is pulled out along an arrow M.
Figure 6:
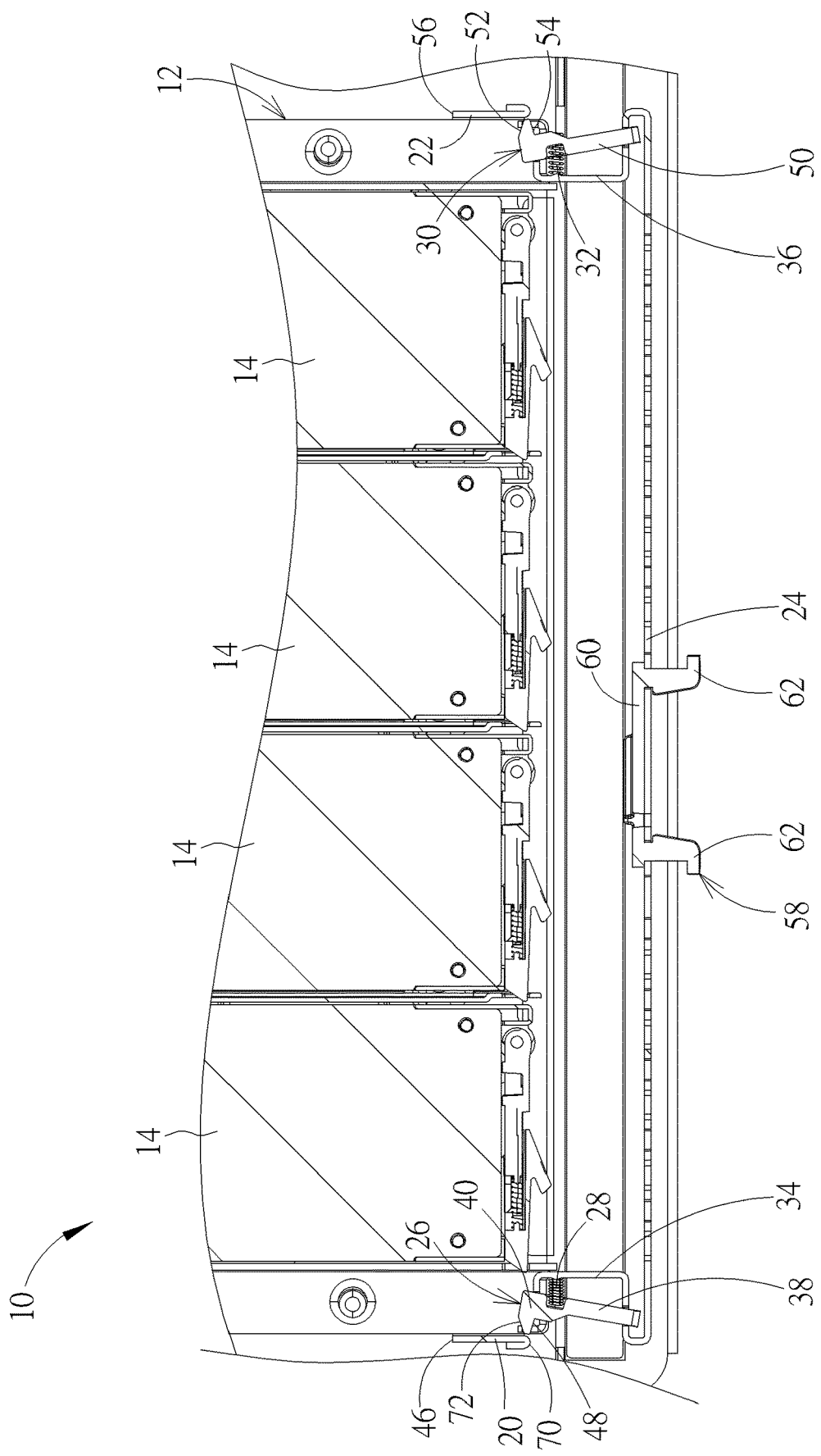
FIG. 6 is a cross-sectional diagram of an assembling slanted surface abutting against a front edge and then sliding rearward relative to the front edge when the cover is pushed inward along an arrow N as shown in FIG. 3.

More detailed description for the cover detaching operation and the cover assembly operation of the server apparatus 10 is provided as follows. Please refer to FIG. 3, FIG. 5, and FIG. 6. FIG. 5 is a cross-sectional diagram of the first detaching slanted surface 48 in FIG. 3 sliding forward relative to the first rear edge 46 when the cover 24 is pulled out along an arrow M. FIG. 6 is a cross-sectional diagram of the assembling slanted surface 72 abutting against the front edge 70 and then sliding rearward relative to the front edge 70 when the cover 24 is pushed inward along an arrow N as shown in FIG. 3. As shown in FIG. 3 and FIG. 5, when the user wants to perform the cover detaching operation of the server apparatus 10, the user just needs to pull the bent arm 62 of the handle 58 to make the cover 24 pulled outward relative to the opening 18 along the arrow M as shown in FIG. 3. During the aforesaid process, the first detaching slanted surface 48 of the first hook end portion 40 can slide forward relative to the first rear edge 46 of the first abutting member 20, so as to bias the first hook end portion 40 to overcome elastic force of the first resilient member 28 and then swing toward the first side portion 34 to be misaligned with the first rear edge 46 as shown in FIG. 5. As such, the first hook end portion 40 can be disengaged from the first abutting member 20. Similarly, during the aforesaid process, the second detaching slanted surface 54 of the second hook end portion 52 can slide forward relative to the second rear edge 56 of the second abutting member 22, so as to bias the second hook end portion 52 to overcome elastic force of the second resilient member 32 and then swing toward the second side portion 36 to be misaligned with the second rear edge 56 as shown in FIG. 5. As such, the second hook end portion 52 can be disengaged from the second abutting member 22. In such a manner, since the first latch 26 and the second latch 30 are no longer engaged with the first abutting member 20 and the second abutting member 22, the user can detach the cover 24 from the frame 12 smoothly for subsequent maintenance or replacement of the storage device 14.

On the other hand, as shown in FIG. 3 and FIG. 6, when the user wants to perform the cover assembly operation of the server apparatus 10, the user just needs to push the bent arm 62 of the handle 58 to make the cover 24 pushed inward relative to the opening 18 along the arrow N as shown in FIG. 3. During this process, the assembling slanted surface 72 of the first hook end portion 40 can abut against the front edge 70 of the first abutting member 20 and then slide rearward relative to the front edge 70, so as to bias the first hook end portion 40 to swing to a position as shown in FIG. 6 and then move the first hook end portion 40 rearward along the first abutting member 20 to a position where the first resilient member 28 drives the first hook end portion 40 to hook the first abutting member 20 as shown in FIG. 3. Accordingly, the first detaching slanted surface 48 abuts against the first rear edge 46. Similarly, the second hook end portion 52 can also swing to a position as shown in FIG. 6 and then move rearward along the second abutting member 22 to a position where the second resilient member 32 drives the second hook end portion 52 to hook the second abutting member 22 as shown in FIG. 3. In such a manner, since the first latch 26 and the second latch 30 elastically hook the first abutting member 20 and the second abutting member 22, the user can fix the cover 24 at a position on the frame 12 corresponding to the opening 18 steadily to provide a dustproof and EMI shielding function for the storage device 14.

In summary, the present disclosure adopts the design that the latch protruding rearward from the cover hooks the abutting member located at the side portion of the frame, to allow that the user can fix the cover at the opening of the frame or detach the cover from the frame quickly and effortlessly via the aforesaid simple operations, so as to improve operational convenience of the server apparatus in assembling or disassembling the cover. Furthermore, via the thinning design of the cover structure, the present disclosure can efficiently solve the prior art problem that the design of additionally disposing the hook mechanism on the cover structure increases the overall thickness of the cover structure to occupy excessive front-end space of the frame, so as to be advantageous to the thinning design of the server apparatus. Moreover, the present disclosure can also allow a long storage device (e.g. EDSFF drive) to be disposed in the frame, so as to greatly improve flexibility of the server apparatus in mounting the storage device.

Figure 7:
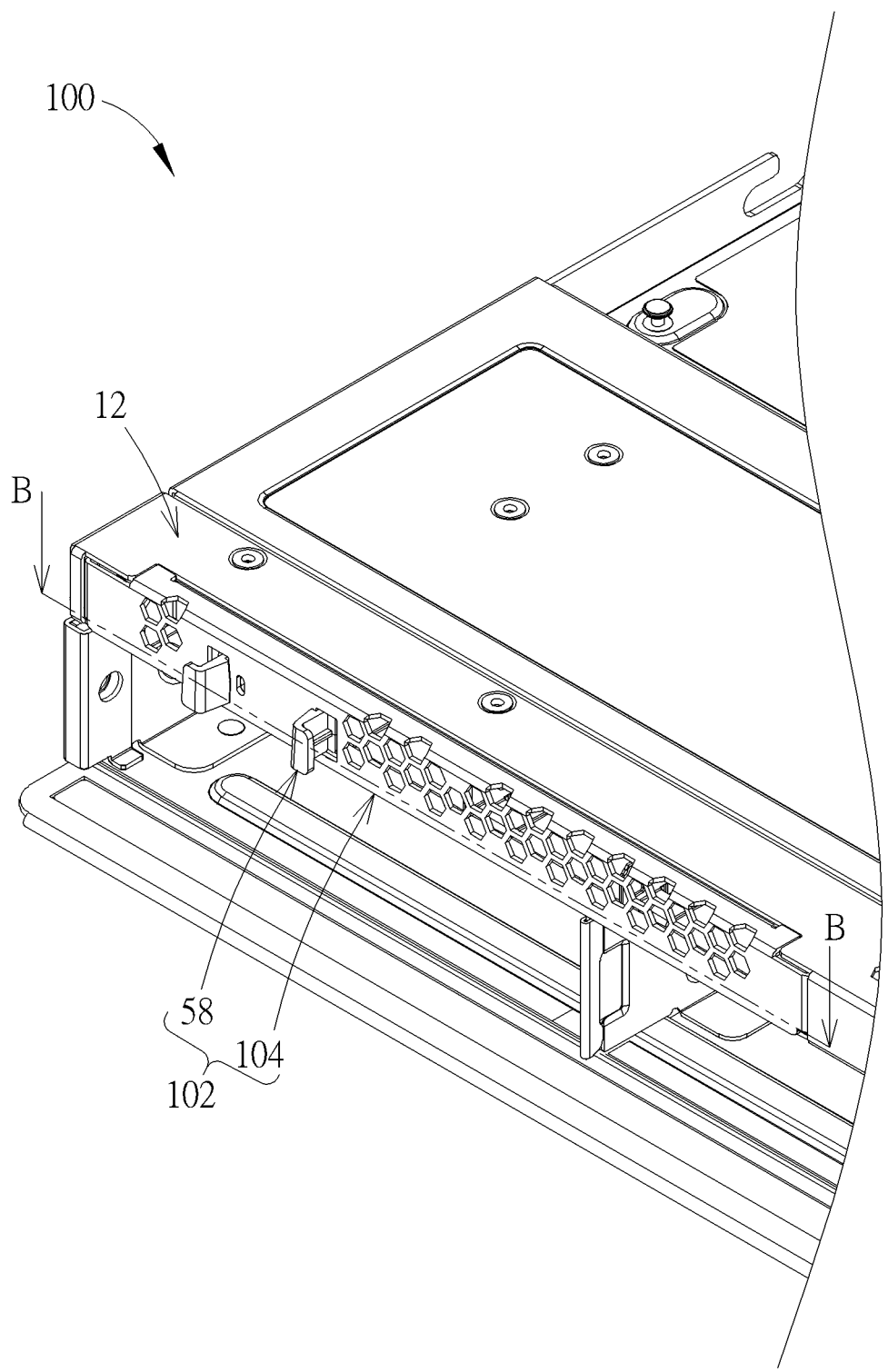
FIG. 7 is a partial enlarged diagram of a server apparatus according to another embodiment.
Figure 8:
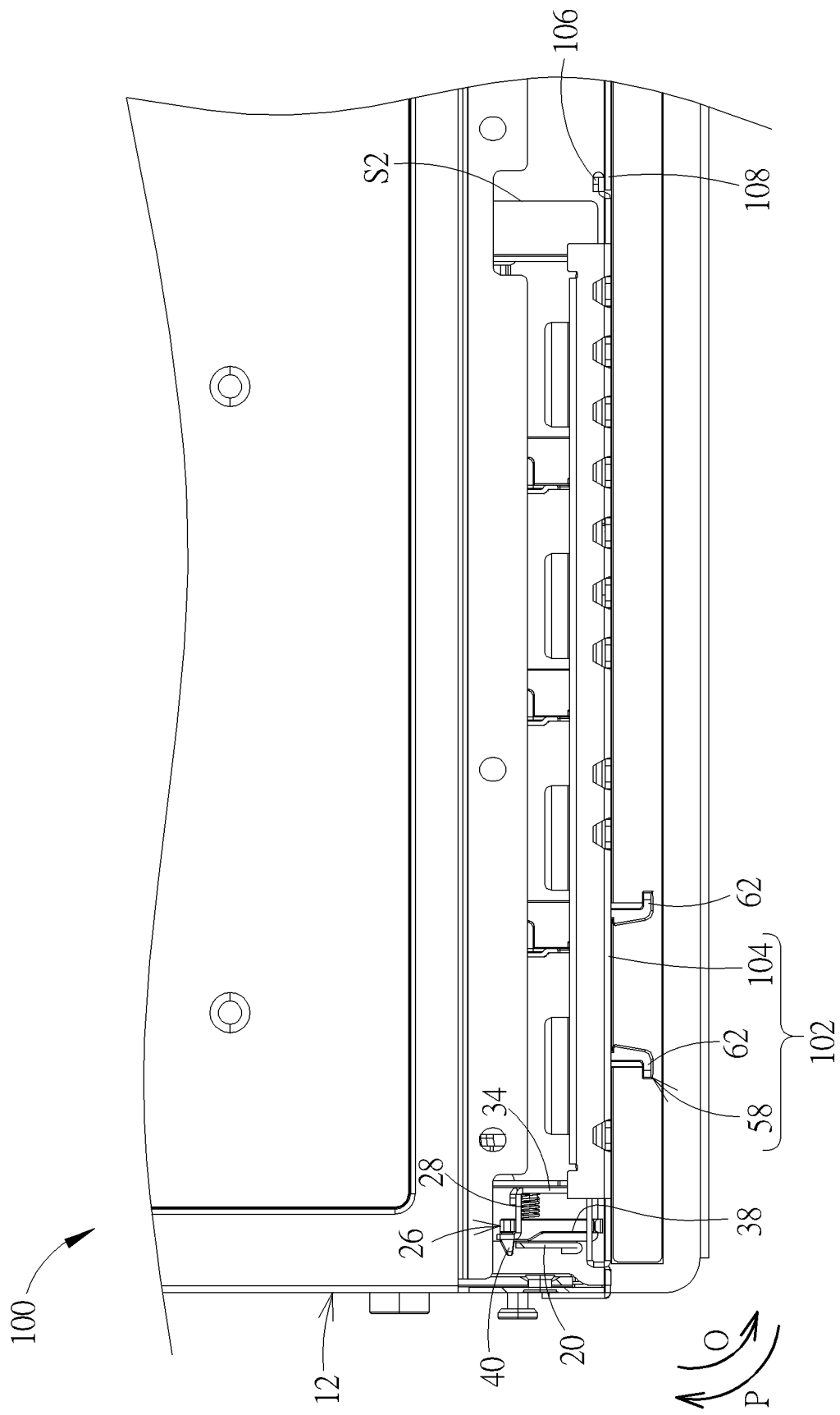
FIG. 8 is a cross-sectional diagram of the server apparatus in FIG. 7 along a cross-sectional line B-B.

It should be mentioned that the present disclosure could adopt one-sided latch hooking design. For example, please refer to FIG. 7 and FIG. 8. FIG. 7 is a partial enlarged diagram of a server apparatus 100 according to another embodiment. FIG. 8 is a cross-sectional diagram of the server apparatus 100 in FIG. 7 along a cross-sectional line B-B. Components both mentioned in this embodiment and the aforesaid embodiment represent components with similar structures or functions, and the related description is omitted herein. As shown in FIG. 7 and FIG. 8, the server apparatus 100 includes a cover structure 102, the frame 12, and the storage device 14. The cover structure 102 includes a cover 104, the first latch 26, and the first resilient member 28. In this embodiment, an inward bent edge 106 is preferably formed on the cover 104 corresponding to the second side S2 of the frame 12, and an abutting portion 108 is formed on the frame 12 corresponding to the inward bent edge 106. Accordingly, the inward bent edge 106 can laterally abut against the abutting portion 108 to make the cover 104 take the abutting portion 108 as a fulcrum to be pivotable relative to the opening 18.

Figure 9:
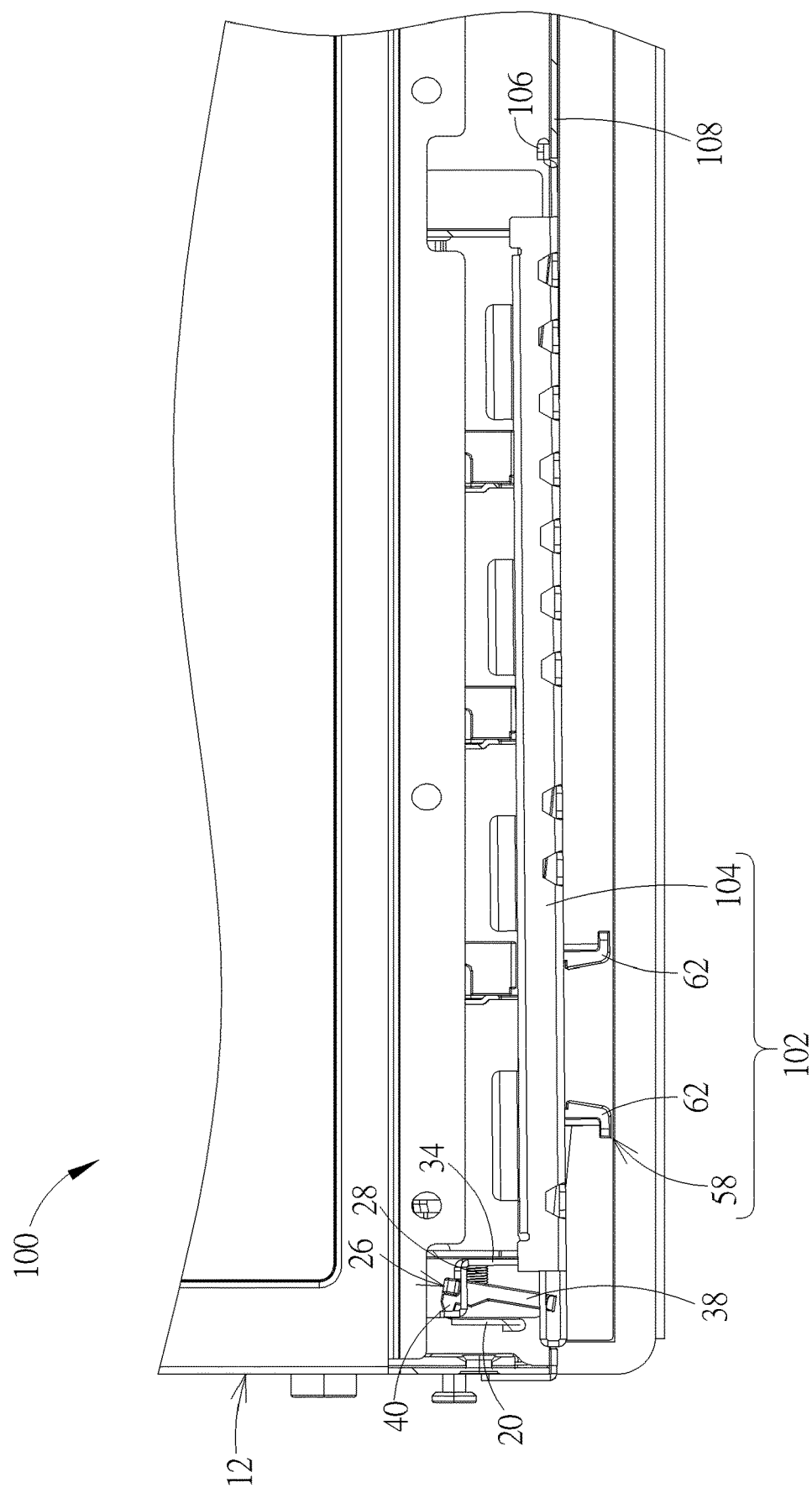
FIG. 9 is a cross-sectional diagram of a cover in FIG. 8 being rotated outward along an arrow O.

Via the aforesaid designs, as shown in FIG. 8 and FIG. 9, when the user wants to perform the cover detaching operation of the server apparatus 100, the user just needs to pull the bent arm 62 of the handle 58 to rotate the cover 104 outward along an arrow O as shown in FIG. 3. During this process, the cover 104 can take the abutting portion as a fulcrum to rotate outward, and the first hook end portion 40 of the first latch 26 can slide forward relative to the first abutting member 20 and swing toward the first side portion 34 to be misaligned with the first abutting member 20 as shown in FIG. 9. Accordingly, the first hook end portion 40 can be disengaged from the first abutting member 20. In such a manner, since the first latch 26 no longer hooks the first abutting member 20, the user can rotate the cover 104 out of the frame 12 smoothly for subsequent maintenance or replacement of the storage device 14.

Figure 10:
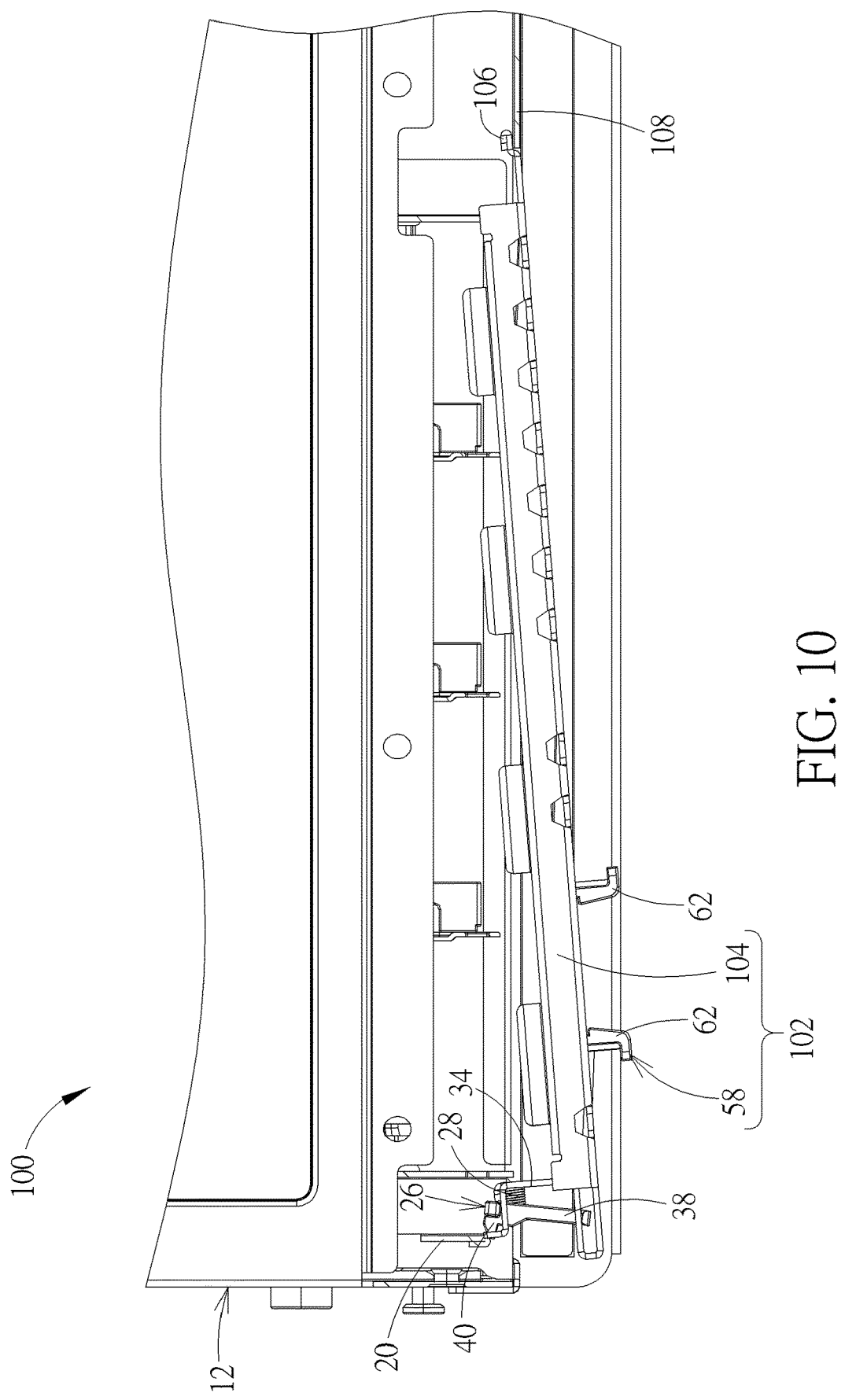
FIG. 10 is a cross-sectional diagram of the cover being rotated inward along an arrow P as shown in FIG. 8.

On the other hand, when the user wants to perform the cover assembly operation of the server apparatus 100, the user just needs to abut the inward bent edge 106 of the cover 104 laterally against the abutting portion 108 of the frame 12, and then pushes the bent arm 62 of the handle 58 to rotate the cover 104 inward along an arrow P as shown in 8. During this process, the cover 104 can take the abutting portion 108 as a fulcrum to rotate inward, and the first latch 26 abuts against the first abutting member 20 to make the first hook end portion 40 swing to a position as shown in FIG. 10. Subsequently, the first hook end portion 40 can move rearward along the first abutting member 20 to a position where the first resilient member 28 drives the first hook end portion 40 to hook the first abutting member 20 as shown in FIG. 8. In such a manner, since the inward bent edge 106 laterally abuts against the abutting portion 108 and the first latch 26 hooks the first abutting member 20, the user can fix the cover 104 on the frame 12 steadily for providing a dustproof and EMI shielding function for the storage device 14.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server apparatus comprising:
a frame having an opening, a side of the frame having a first abutting member disposed thereon;
at least one storage device contained in the frame through the opening; and
a cover structure disposed on the frame corresponding to the opening, the cover structure comprising:
a cover detachably covering the opening and having a first side portion;
a first latch located between the first side portion and the first abutting member, the first latch having a first connection end portion and a first hook end portion, the first side portion having a through hole formed corresponding to the first connection end portion, at least one hook arm extending from the first connection end portion, the at least one hook arm being movably engaged with the through hole to make the first hook end portion swingable relative to the first side portion, the first hook end portion having a first detaching slanted surface formed thereon; and
a first resilient member connected to the first latch and the first side portion to drive the first hook end portion to abut the first detaching slanted surface against the first abutting member, for detachably fixing the cover at the opening.

2. The server apparatus of claim 1, wherein the first hook end portion further has an assembling slanted surface corresponding to the first abutting member; with movement of the cover relative to the opening, the assembling slanted surface abuts against the first abutting member and then moves relative to the first abutting member, so as to bias the first hook end portion toward the first side portion and then move the first hook end portion along the first abutting member to a position where the first resilient member drives the first hook end portion to hook the first abutting member for making the first detaching slanted surface abut against the first abutting member.

3. The server apparatus of claim 1, wherein the first side portion has at least one blocking arm extending toward the first hook end portion, at least one protruding portion protrudes from the first hook end portion corresponding to the at least one blocking arm, and the at least one blocking arm blocks the at least one protruding portion to limit a movement range of the first hook end portion relative to the first side portion.

4. The server apparatus of claim 1, wherein a tilt angle between the first detaching slanted surface and the first connection end portion is between 95° and 110°.

5. The server apparatus of claim 1, wherein the cover structure further comprises:
a handle disposed on the cover to make the cover operable to being pulled or pushed.

6. The server apparatus of claim 5, wherein the handle has a sheet and at least one bent arm, the cover has a through hole formed thereon corresponding to the at least one bent arm, the at least one bent arm protrudes from the sheet, a recessed structure is formed at a position where the at least one bent arm is connected to the sheet, and the recessed structure is engaged with a hole edge of the through hole for fixing the handle at the cover when the at least one bent arm penetrates through the through hole.

7. The server apparatus of claim 1, wherein another side of the frame has a second abutting member disposed thereon, the cover further has a second side portion, and the cover structure further comprises:

a second latch located between the second side portion and the second abutting member, the second latch having a second connection end portion and a second hook end portion, the second connection end portion being movably disposed on the second side portion to make the second hook end portion movable, the second hook end portion having a second detaching slanted surface formed thereon corresponding to the second abutting member, the second hook end portion being disengaged from the second abutting member via relative sliding between the second detaching slanted surface and the second abutting member with movement of the cover relative to the opening; and
a second resilient member connected to the second latch and the second side portion to drive the second hook end portion to abut the second detaching slanted surface against the second abutting member, for detachably fixing the cover at the opening.

8. The server apparatus of claim 1, wherein an inward bent edge is formed on the cover corresponding to another side of the frame, an abutting portion is formed on the frame corresponding to the inward bent edge, and the inward bent edge laterally abuts against the abutting portion to make the cover take the abutting portion as a fulcrum to be pivotable relative to the opening.

9. The server apparatus of claim 1, wherein the first side portion is bent inward from a position on the cover corresponding to the side of the frame to be opposite to the first abutting member.

10. A cover structure disposed corresponding to an opening of a frame of a server apparatus, a side of the frame having a first abutting member disposed thereon, at least one storage device being contained in the frame through the opening, the cover structure comprising:
a cover detachably covering the opening and having a first side portion;
a first latch located between the first side portion and the first abutting member, the first latch having a first connection end portion and a first hook end portion, the first side portion having a through hole formed corresponding to the first connection end portion, at least one hook arm extending from the first connection end portion, the at least one hook arm being movably engaged with the through hole to make the first hook end portion swingable relative to the first side portion, the first hook end portion having a first detaching slanted surface formed thereon; and
a first resilient member connected to the first latch and the first side portion to drive the first hook end portion to abut the first detaching slanted surface against the first abutting member, for detachably fixing the cover at the opening.

11. The cover structure of claim 10, wherein the first hook end portion further has an assembling slanted surface corresponding to the first abutting member; with movement of the cover relative to the opening, the assembling slanted surface abuts against the first abutting member and then moves relative to the first abutting member, so as to bias the first hook end portion toward the first side portion and then move the first hook end portion along the first abutting member to a position where the first resilient member drives the first hook end portion to hook the first abutting member for making the first detaching slanted surface abut against the first abutting member.

12. The cover structure of claim 10, wherein the first side portion has at least one blocking arm extending toward the first hook end portion, at least one protruding portion protrudes from the first hook end portion corresponding to the at least one blocking arm, and the at least one blocking arm blocks the at least one protruding portion to limit a movement range of the first hook end portion relative to the first side portion.

13. The cover structure of claim 10, wherein a tilt angle between the first detaching slanted surface and the first connection end portion is between 95° and 110°.

14. The cover structure of claim 10, wherein the cover structure further comprises:
   a handle disposed on the cover to make the cover operable to being pulled or pushed.

15. The cover structure of claim 14, wherein the handle has a sheet and at least one bent arm, the cover has a through hole formed thereon corresponding to the at least one bent arm, the at least one bent arm protrudes from the sheet, a recessed structure is formed at a position where the at least one bent arm is connected to the sheet, and the recessed structure is engaged with a hole edge of the through hole for fixing the handle at the cover when the at least one bent arm penetrates through the through hole.

16. The cover structure of claim 10, wherein another side of the frame has a second abutting member disposed thereon, the cover further has a second side portion, and the cover structure further comprises:
   a second latch located between the second side portion and the second abutting member, the second latch having a second connection end portion and a second hook end portion, the second connection end portion being movably disposed on the second side portion to make the second hook end portion movable, the second hook end portion having a second detaching slanted surface formed thereon corresponding to the second abutting member, the second hook end portion being disengaged from the second abutting member via relative sliding between the second detaching slanted surface and the second abutting member with movement of the cover relative to the opening; and
   a second resilient member connected to the second latch and the second side portion to drive the second hook end portion to abut the second detaching slanted surface against the second abutting member, for detachably fixing the cover at the opening.

17. The cover structure of claim 10, wherein an inward bent edge is formed on the cover corresponding to another side of the frame, an abutting portion is formed on the frame corresponding to the inward bent edge, and the inward bent edge laterally abuts against the abutting portion to make the cover take the abutting portion as a fulcrum to be pivotable relative to the opening.

18. The cover structure of claim 10, wherein the first side portion is bent inward from a position on the cover corresponding to the side of the frame to be opposite to the first abutting member.

* * * * *